(12) United States Patent
Liu

(10) Patent No.: US 7,504,891 B1
(45) Date of Patent: Mar. 17, 2009

(54) INITIALIZATION CIRCUIT FOR A PHASE-LOCKED LOOP

(75) Inventor: Peng Liu, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 133 days.

(21) Appl. No.: 11/801,974

(22) Filed: May 10, 2007

(51) Int. Cl.
*H03L 7/00* (2006.01)

(52) U.S. Cl. .................. 331/16; 331/34; 331/177 R; 331/1 A; 331/185; 327/156; 375/376

(58) Field of Classification Search ............ 331/16, 331/17, 34, 1 A, 185; 327/156; 375/376
See application file for complete search history.

(56) References Cited

U.S. PATENT DOCUMENTS 7,312,663 B2 * 12/2007 Abel ..................... 331/16

7,409,031 B1 * 8/2008 Lee et al. ................ 375/376

OTHER PUBLICATIONS

J.G. Maneatis, et al., "Self-Biased High-Bandwidth Low Jitter 1-to-4006 Multiplier Clock Generator PLL", pp. 1795-1803, IEEE Journal of Solid-StateCircuits, vol. 38, No. 11, Nov. 2003.
J.G. Maneatis "Low-Jitter Process-Independent DLL and PLL Based on Self-Biased Techniques", pp. 1723-1732, IEEE Journal of Solid-StateCircuits, vol. 31, No. 11, Nov. 1996.

* cited by examiner

*Primary Examiner*—Arnold Kinkead
(74) *Attorney, Agent, or Firm*—Justin Liu; Lois D. Cartier

(57) ABSTRACT

Integrated circuit including a phase-locked loop (PLL) circuit having a first mode and a second mode of operation. Operating the PLL circuit in the first mode may generate a constant frequency responsive to a programmable bias. Operating the PLL circuit in the second mode may generate a frequency tracking a reference signal coupled to an input of the PLL circuit.

14 Claims, 7 Drawing Sheets

INITIALIZATION CIRCUIT FOR A PHASE-LOCKED LOOP

FIELD OF THE INVENTION

The invention relates to integrated circuit (IC) devices. More particularly, the invention relates to a phase-locked loop (PLL) of an IC.

BACKGROUND

Most integrated circuits (ICs) that may require accurate data recovery or data transmission may include a phase-locked loop (PLL) circuit. In general, a PLL is a closed loop feedback system that may generate an output frequency that has a phase and frequency relationship to a reference signal coupled to the PLL input. A typical PLL circuit may require a reference signal coupled to first input of a phase frequency detector circuit, a charge-pump circuit coupled between the phase frequency detector circuit and a controlled oscillator circuit, a loop-filter optionally coupled to the output of the charge-pump circuit, and a divider circuit coupled between the controlled oscillator circuit and the phase frequency detector circuit, where an output of the divider circuit is coupled to a second input of the phase frequency detector circuit.

While the basic PLL architecture has remained nearly the same since it was invented, its implementation in different technologies and for the various applications continue to be a very challenging subject. For example, a PLL serving the task of clock generation in a microprocessor may appear similar to a frequency synthesizer used in a digital signal processor (DSP), but the actual circuit may be designed quite differently.

As technologies continue to advance and ICs require faster clocks to process the fast data rates, PLL designs are pushed to their performance limit. In an example, a PLL employed by a processor a decade ago may have had a frequency range of 200 MHz, in today's processors may require a PLL having a frequency range of 2 GHz. Additionally, the voltage at which the PLL is required to perform has decreased, from typically 5.0 volts to about 1.0 volt.

A problem with PLLs that may have a wide frequency range is lock acquisition. A PLL is considered in lock or in lock acquisition mode is when the divided output frequency and/or phase of the PLL match the frequency and/or phase of the reference signal. Suppose a PLL circuit is initialized, the PLL circuit may generate an initial output frequency outside the design operating range. The divider circuit which provides the divided output may generate a frequency far from the input reference signal, i.e., the PLL is not locked. The transition of the PLL from unlocked condition to a locked PLL condition may be a very nonlinear phenomenon because the phase detector may be receiving unequal frequencies. Even if the PLL may have a wide acquisition range, the loop may not lock unless the difference between the input reference signal and the feedback clock falls within a certain range. Variations in process, voltage, and temperature may amplify the issue of the PLL design and therefore lock acquisition.

Therefore, the need exists for a PLL with initialization circuit which may provide a feedback clock that has a frequency in range of a frequency of the reference signal source. In such instances, it would be advantageous to have a PLL circuit that can have a reliable initial frequency over a range of process, voltage, and temperature variations.

SUMMARY

According to an embodiment of the present invention, a phase-locked loop (PLL) having a phase frequency detector having a first input coupled to receive a reference signal, a charge-pump coupled to the phase frequency detector, where the charge-pump may generate a first control and a second control. A loop-filter has an input selectively coupled to receive the first control or the second control. A controlled oscillator coupled to the loop-filter, and a divider circuit coupled between an output of the controlled oscillator and a second input of the phase frequency detector. The controlled oscillator may generate a constant frequency when operating the PLL in a first mode based on the loop-filter input receiving the first control, and the controlled oscillator may generates a frequency-tracking the reference signal when operating the PLL in a second mode based on the loop-filter input receiving the second control.

In another embodiment of the present invention, an Integrated circuit (IC) may include a PLL. The PLL of the IC may include a phase frequency detector having a first input coupled to a reference signal, a charge-pump coupled to the phase frequency detector and generating a first control and a second control. The PLL may also include a controlled oscillator, a loop-filter coupled to the controlled oscillator, a decision circuit having a decision circuit output, a first and a second decision circuit inputs coupled to the first control and second control respectively, and a select input. A divider circuit of the PLL may be coupled between the controlled oscillator and a second input of the phase frequency detector. A select signal coupled to the select input of the decision circuit may selectively couple one of the first control and the second control to the loop-filter. A divider coupled between the controlled oscillator and the phase frequency detector to complete a feedback path of the PLL. The controlled oscillator may generates a constant frequency when operating the PLL in a first mode based on the loop-filter receiving the first control, and the controlled oscillator may generates a frequency tracking the reference signal when operating the PLL in a second mode based on the loop-filter receiving the second control. The IC may also have a current-bias source having numerous current-bias outputs, where at least one current-bias output of the numerous current-bias outputs is programmable and coupled to the charge-pump.

BRIEF DESCRIPTION OF THE DRAWINGS

The present invention is illustrated by way of example, and not by way of limitation, in the following figures.

DETAILED DESCRIPTION OF THE DRAWINGS

While the specification concludes with claims defining some features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and/or functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention. In other instances, well-known circuits and devices may be omitted or presented in an abstract form in order to avoid obscuring the present invention.

Figure 1:
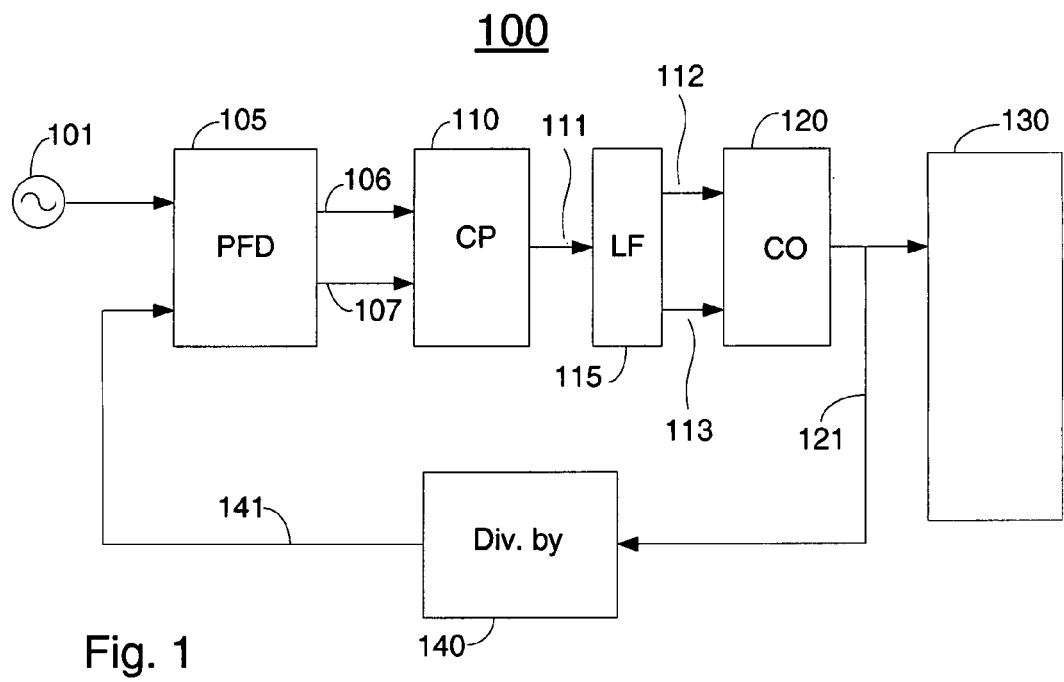
FIG. 1 shows a block diagram representing a phase-locked loop (PLL) circuit.

FIG. 1 shows a block diagram representing a phase-locked loop (PLL) circuit 100. In general, the PLL circuit 100 may require a reference signal 101 or a reference clock that is needed in order to facilitate operating the PLL circuit 100 to generate an output signal 121 or an output clock. Signal 121 may have a phase and frequency relationship to the reference signal source 101 when the PLL circuit 100 is operated in a normal mode or a second mode. The reference signal source 101 may be coupled to a phase frequency detector (PFD) circuit 105. In other instances, we may also refer to circuit 105 as a phase detector (PD) circuit. Signal 141 may also be coupled to the PFD circuit 105, where the signal 141 is the divided version of an output signal or clock 121 generated by the PLL circuit 100. Signal 141 may have the same frequency and/or phase as reference signal source 101 when the PLL circuit 100 is operating normally. The PFD circuit 105 may generate output signals 106 and 107 indicative of a frequency and/or phase difference between the reference signal source 101 and signal 141. The PFD circuit 105 may be coupled to a charge-pump (CP) circuit 110. The CP circuit 110 may be coupled to receive signals 106 and 107, and generate output signal 111. Signal 111 is a bias voltage responsive to signals 106 and 107 of the PFD circuit 105. The output signal 111 of the CP circuit 110 may be coupled to a loop-filter (LF) or a loop-filter circuit 115. Output signals 112 and 113 from the LF circuit 115 may be coupled to inputs of a controlled oscillator (CO) or a controlled oscillator circuit 120. The LF circuit 115 may be a low pass filter used to suppress a voltage ripple or noise on signal 111. In general, the LF circuit 115 may be internal or external to an IC, and may provide a stable bias to a controlled oscillator. The CO circuit 120 may generate an oscillating or clock output signal 121, where the signal 121 may oscillate at a higher frequency, or lower frequency in response to the bias range realized at inputs of the controlled oscillator 120. The oscillating output signal 121 may be coupled to circuit 130 and circuit 140. Circuit 130 may be a circuit requiring a signal or clock input having a relationship to the reference signal 101. Circuit 140 is a divide by N circuit or a divider circuit, where N is a programmable value that may provide a feedback signal or a divided-down output signal 141 of the CO circuit 120 of the PLL circuit 100 to the PFD circuit 105. Circuit 140 may receive the signal 121 and may generate at least one divided-down output, where the divided-down output may be signal 141 having a phase and/or frequency similar to the reference signal 101 when the PLL circuit 100 in locked mode or normal operation. Signal 141 is a divided-down version of the signal 121, where signal 121 is the output of the PLL circuit 100. Therefore, signal 141 maintains a frequency and/or phase relationship to the signal 121.

Figure 2:
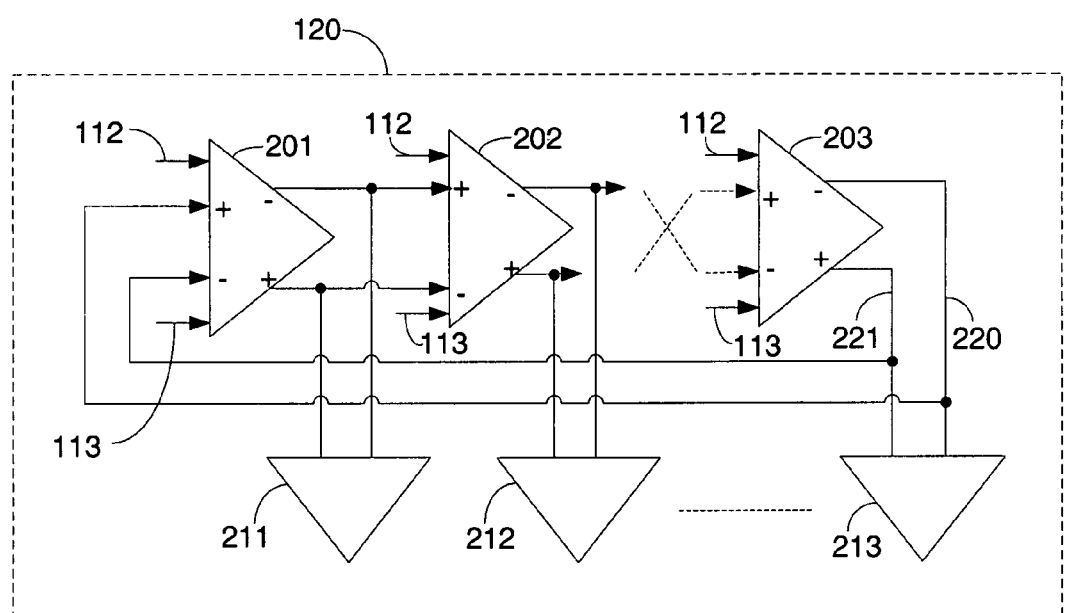
FIG. 2 illustrates a controlled oscillator circuit according to an embodiment of the present invention.

FIG. 2 illustrates a controlled oscillator (CO) circuit 120 according to an embodiment of the present invention. Elements 201-203 may be differential delay circuits of the CO circuit 120, coupled to one another as illustrated in FIG. 2 to form a differential ring oscillator circuit. Each of the delay circuits 201-203 may be similar to one another and each of the delay circuits 201-203 may behave as differential inverters. Other methods of coupling the differential delay circuits 201-203 to from a differential ring oscillator is well know to persons skilled in the art. The CO circuit 120 of FIG. 2 may also include elements 211-213, where elements 211-213 may be differential buffer circuits coupled to receive outputs from delay circuits 201-203. In one example, an even number of differential delay circuits may be coupled to implement the differential ring oscillator. For instance, a four stage differential ring oscillator circuit may be implemented simply by coupling one delay circuit (i.e., delay circuit 203) such that it does not invert. A person skilled in the art may determine a ring oscillator circuit requirements that may best fit their application or/and design. The buffer circuits 211-213 may provide buffered signals of the delay circuits 201-203, where each signal of the buffered signals may have the same frequency but they may have a phase different from one another.

Figure 3:
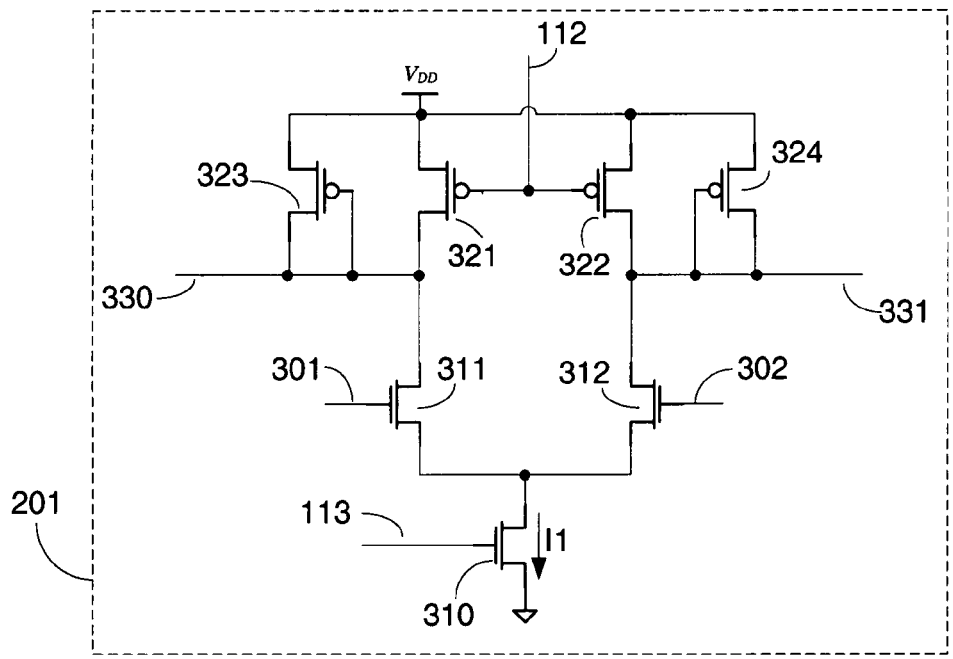
FIG. 3 illustrates schematically a delay circuit of the controlled oscillator circuit according to an embodiment of the present invention.

FIG. 3 illustrates schematically a delay circuit 201 of the CO circuit 120 of FIG. 2 according to an embodiment of the present invention. The differential delay circuit 201 of FIG. 3 may be referred to as a current controlled delay circuit, where a current bias coupled to the delay circuit 201 may control its delay. A circuit may provide biases to signals 112 and 113 to control the delay through delay circuit 201. For example, the CP circuit 110 of FIG. 1 in conjunction with the LF circuit 115 of FIG. 1 may provide an appropriate bias to the delay circuit 201. The bias voltages may be coupled to signals 112, and 113. Bias voltage coupled to signal 112 and bias voltage coupled to signal 113 may have different absolute value, but they may complement one another in biasing the PMOS transistors 321 and 322 and the NMOS transistor 310 respectively. The current sourced from the Vdd supply source may equal the current I1 across transistor 310 of FIG. 3.

The delay circuit 201 of FIG. 3 may include a differential input stage consisting of NMOS transistors 311 and 312, where signal 301 may be a positive input terminal of the delay circuit 201, and signal 302 may be a negative input terminal of the delay circuit. The source nodes of transistors 311 and 312 may be coupled to one another and to a drain node of NMOS transistor 310. Transistor 310 may control the I1 current value by applied bias voltage coupled to signal 113, which may be coupled to a gate node of transistor 310. The drain nodes of NMOS transistors 311 and 312 may be coupled to drain nodes of PMOS transistors 321 and 322 respectively. A drain node of transistor 311 may be coupled to signal 330, which may represent a negative output terminal, and drain node of transistor 312 may be coupled to signal 331, which may represent positive output terminal of the delay circuit 201 of FIG. 3.

PMOS transistors 321 and 322 may have their source nodes coupled to the Vdd supply source, the drain node of transistor 321 may be coupled to the drain node of transistor 311, and the drain node of transistor 322 may be coupled to the drain node of transistor 312. The gate nodes of transistors 321 and 322 may be coupled to one another and to signal 112, which may supply a bias. Signal 112 may control the operation of the PMOS transistors 321 and 322. In general, the current through a transistor can be represented as $I_D=½\mu C_{OX}(W/L)(V_{GS}-V_{th})^2$, where $I_D$ is the current observed at a drain node of a transistor, $V_{th}$ is the threshold voltage of a transistor, $V_{GS}$ is the observed gate-source voltage of a transistor, W and L are the width and the length of a transistor respectively, and $\mu C_{OX}$ is a process constant. The current $I_D$ observed at the drain node of a transistor depends on process parameters which may include $\mu C_{OX}$, $V_{th}$, and design parameters witch may include W, L, and $V_{GS}$. Bias signals 112 and 113 may control the current I1 through transistor 310 of FIG. 3, and therefore the delay across the delay circuit 201 of FIG. 3. In general, if higher bias value is supplied by signal 113, greater current may flow through the NMOS transistor 310. Conversely, if lower bias value is supplied by signal 112, greater current may flow through the PMOS transistors 321 and 322. PMOS transistors 323 and 324 are diode-connected loads. Source nodes of transistors 323 and 324 may be coupled to the Vdd supply source. Drain and gate nodes of transistor 323 may be coupled to one another and to signal 330, which may represent negative output terminal. Drain and gate nodes of transistor 323 may be coupled to one another and to signal 331, which may represent positive output terminal. Alternative methods and/or implementations to the diode-connected PMOS transistors 323 and 324 are well known to skilled persons in the art.

Delay circuit 201 may receive differential or complementary input signals 301 and 302 (i.e., the gate nodes of NMOS transistors 311 and 312 respectively), and signals 112 and 113 may provide the bias values to gate nodes of PMOS transistors 321 and 322 and NMOS transistor 310 respectively. The delay circuit 201 may generate differential or complementary output signals 330 and 331 (i.e., the drain nodes of transistors 311 and 312 respectively). If signal 301 is logic high, meaning signal 302 is logic low, transistor 311 may be turned on, and transistor 312 may be turned off. While transistor 311 is turned on and transistor 312 is turned off, output signal 330 is pulled low or logic low by transistor 310. Conversely, signal 331 is pulled high or logic high by transistor 322. If signal 301 is logic low, meaning signal 302 is logic high, transistor 311 may be turned off, and transistor 312 may be turned on. While transistor 311 is turned off and transistor 312 is turned on, output signal 330 is pulled high or logic high by transistor 321. Conversely, signal 331 is pulled low or logic low by transistor 310.

Logic values coupled to differential input signals 301 and 302 may be inverted and coupled to the differential output signals 330 and 331. Table 1 is a representation on input stimulus versus output response for delay circuit 201 of FIG. 3. Signals 301 and 302 may have input values presented to the delay circuit 201, while signals 330 and 331 may have output values as response of the delay circuit 201. Zero (0) may represent logic low, and one (1) may represent logic high.

TABLE 1

| Signal 301 | Signal 302 | Signal 330 | Signal 331 |
|---|---|---|---|
| 0 | 1 | 1 | 0 |
| 1 | 0 | 0 | 1 |

Signals 112 and 113 may provide bias voltages that may control the delay through the delay circuits 201-203 of FIG. 2. For instance, bias values coupled to signals 112 and 113 may introduce a delay through the delay circuit 201. If the bias values coupled to signals 112 and 113 varies, the delay through the delay circuit 201 may vary accordingly.

Figure 4:
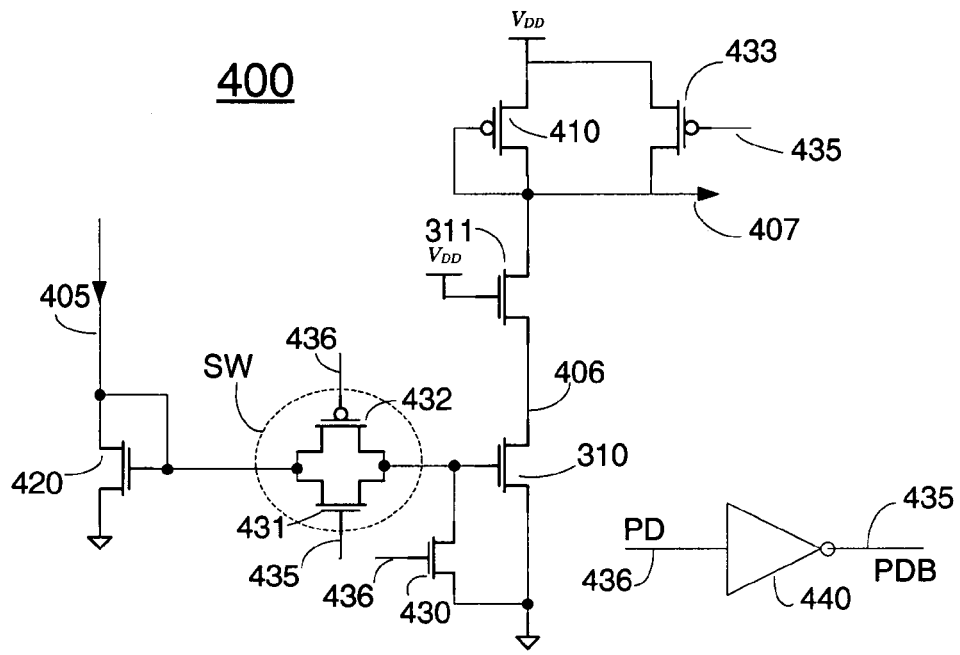
FIG. 4 illustrates schematically a control circuit according to an embodiment of the present invention.

FIG. 4 illustrates schematically a control circuit 400 according to an embodiment of the present invention. Circuit 400 may be a replica circuit of the delay circuit 201 illustrated in FIG. 3 with additional transistors 430-433 which when asserted may power-down (PD) or disable the control circuit 400. Control circuit 400 illustrates the use of transistors 310, and 311 of FIG. 3. The transistors 310 and 311 of circuit 400 are the same type, and size as transistors of circuit 201 of FIG. 3. PMOS transistor 410 of control circuit 400 may be equivalent in size to a combination of PMOS transistors 321 and 323. A more detailed explanation of circuit 400 operations and advantageous may be described below. Inverter 440 may receive signal 436, where signal 436 may be a PD signal, and generate signal 435 (PDB). The PD signal may be coupled to gate nodes of NMOS transistor 430 and PMOS transistor 432, and the PDB signal, signal 435, may be coupled to gate nodes of NMOS transistor 431 and PMOS transistor 433. The PMOS transistor 432 and the NMOS transistors 431 may be coupled to form a switch. The switch may be controlled by signals PD and PDB coupled to gate nodes of transistors 432 and 43 respectively. The drain nodes of NMOS transistors 431 and PMOS transistor 432 may be coupled together forming an input of the switch, and the source nodes of NMOS transistor 431 and PMOS transistor 432 may be coupled together forming an output of the switch. NMOS transistor 430 and PMOS transistor 433 may be part of the power-down circuit. Transistor 430 may have a gate node coupled to the PD signal, a source node coupled to a ground potential (0V), and a drain node coupled to the gate node of NMOS transistor 310 of FIG. 4. Transistor 433 may have a gate node coupled to the PDB signal, a source node coupled to the Vdd supply source, and a drain node coupled to a drain node of PMOS transistor 323. Table 2 illustrates how circuit 400 may be enabled and/or disabled. Signal 436 may be a PD signal, and signal 435 is the complement PD signal (PDB). Transistors 430-433 may be used to enable or disable the control circuit 400. The last column (Circuit 400 status), are conditions needed to enable and/or disable circuit 400. Zero (0) may represent logic low, and one (1) may represent logic high.

TABLE 2

| Signal 436 | Signal 435 | Transistors | | | | |
|---|---|---|---|---|---|---|
| (PD) | (PDB) | 430 | 431 | 432 | 433 | Circuit 400 status |
| 0 | 1 | Off | On | On | Off | Enabled |
| 1 | 0 | On | Off | Off | On | Disabled |

Control circuit 400 may include NMOS transistor 420 having a source node coupled to the ground potential (0V), a drain node coupled to signal 405 and a gate node coupled to a drain node and to the input of switch of circuit 400. The output of switch of circuit 400 may be coupled to a gate node of NMOS transistor 310. While circuit 400 is enabled, NMOS transistors 420 and 310 may form a current mirror circuit. Therefore, a current value provided by signal 405 may be mirrored to signal 406. NMOS transistor 310 may have a source node coupled to the ground potential (0V), and a drain node coupled to a source node of NMOS transistor 311. NMOS transistor 311 may have a gate node coupled to the Vdd supply source and a drain node coupled to a drain node of transistor 410 and the control circuit output, signal 407. The PMOS transistor 410 has a gate node and a drain node coupled together and to signal 407 and a source node coupled to the Vdd supply source. PMOS transistor 410 is a diode-connected load, while NMOS transistor 311 is coupled to always be on. Other implementations of the diode-connected load PMOS transistor 410 are well known to skilled persons in the art. For instance, circuit 400 may be utilized as a current to voltage converter while it is enabled. Conversely, when circuit 400 is disabled, the output, signal 407, may be pulled up to logic high.

While circuit 400 is enabled, a current value coupled by signal 405 may be mirrored to signal 406. A bias value coupled to signal 407 can be generated at the output of the control circuit 400. The bias may have a value related to the current value coupled to signal 406, and therefore signal 405. The current value coupled to signal 406 may be related to the current value provided by signal 405. The current value of signal 406 may equal to the current value provided by signal 405 multiplied by a ratio factor. The ratio factor may be a ratio of transistor 310 width ($W_{310}$) over transistor 420 width ($W_{420}$). The above statement assumes the length of transistor 420 equals the length of transistor 310. For example, signal 405 may be coupled to transistor 420 to provide a current value X. If the ratio of $W_{310}/W_{420}$ is 1, then signal 406 may have a current value equal to X. In another example, signal 405 may provide a current value X, and the ratio of $W_{310}/W_{420}$ is 2. Signal 406 may have a current value equals to 2×.

Control circuit 400 may be built using the same transistors as the delay circuit 201 of FIG. 3. More specifically, control circuit 400 may use the same size and type of transistors as transistors 310, 311, and a transistor equivalent in size to the size combination of transistors 323 and 321 of circuit 201 of FIG. 3. In another example, circuit 400 may use a scaled down version of the transistors mentioned above. For instance, Circuit 400 may use ⅛ the size of transistors used in circuit 201 of FIG. 3. Control circuit 400 may have a very efficient and small area requirement. Also, it may have similar behavior in tracking the process, voltage, and temperature variations as the delay circuit 201. Circuit 400 may generate a bias voltage coupled to signal 407 based on a current value coupled to signal 405.

Figure 5A:
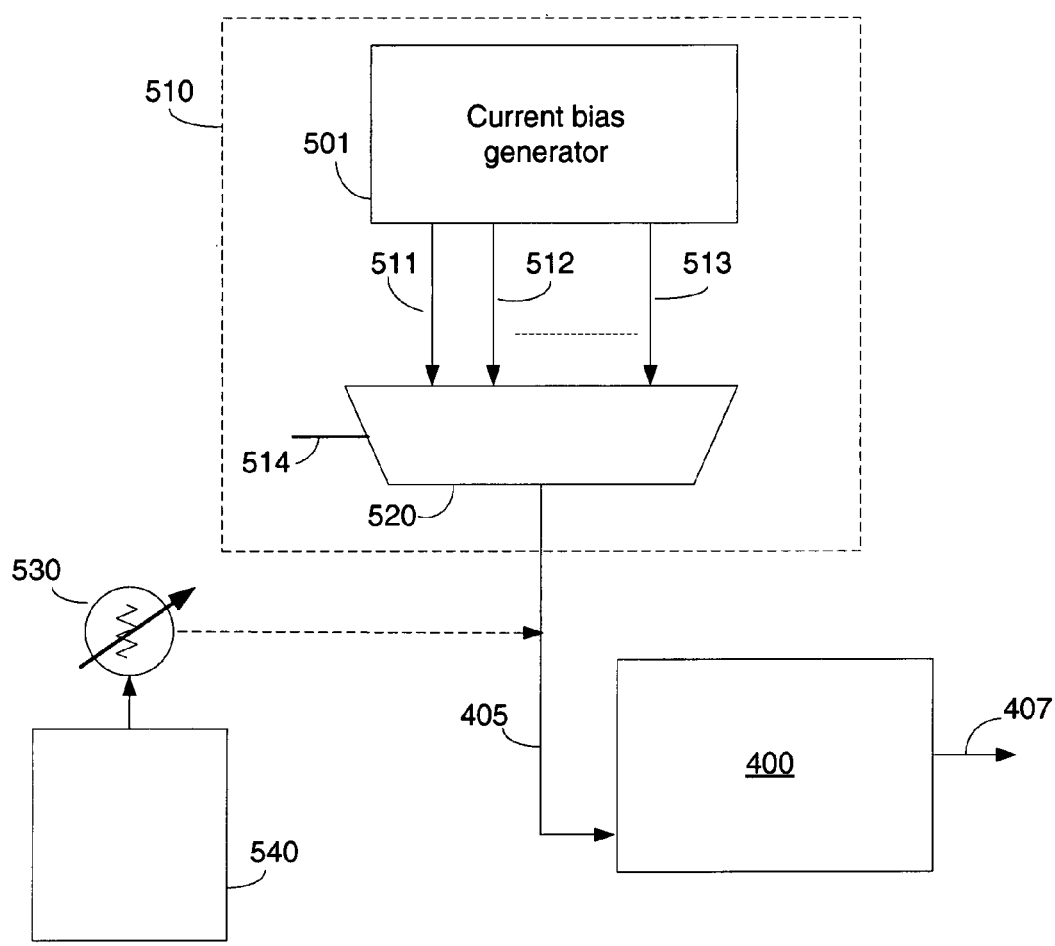
FIG. 5A illustrates a simplified block diagram representing a control circuit according to an embodiment of the present invention.

FIG. 5A illustrates a simplified block diagram representing a control circuit 500 according to an embodiment of the present invention. Circuit 500 may include a current bias generator circuit 501 generating multiple output signals 511-513 that may be coupled to inputs of a select circuit 520. Circuit 520 may have an output coupled to signal 405 and a select control input coupled to signal 514. Signal 405 may be coupled to an input of circuit 400, which has been described in details above. For example, the current bias generator circuit 501 can generate multiple output signals 511-513, each having a current value different from one another. The multiple output signals 511-513 of the bias generator circuit 501 may be coupled to inputs of a select circuit 520 having a select control input coupled to signal 514 and an output coupled to signal 405. The select control signal 514, when asserted, may selectively couple the output of select circuit 520 to one of the multiple input signals 511-513. The select control signal 514 may be manually asserted, or a part of logic circuit, or a programmable logic circuit that may automatically assert a value coupled to signal 514. Circuit 400 may generate a bias value coupled to output signal 407 responsive to a current value provided by signal 405. In another example, signal 405 may be coupled to a programmable bias generator circuit or a programmable current source 530. The programmable bias generator circuit 530 may output a variable current value based on an input received from circuit 540. Circuit 540 may be a feedback circuit, or a control circuit that may be adjusted by a user, or an automatic control circuit that may automatically adjust output current of circuit 530.

Figure 5B:
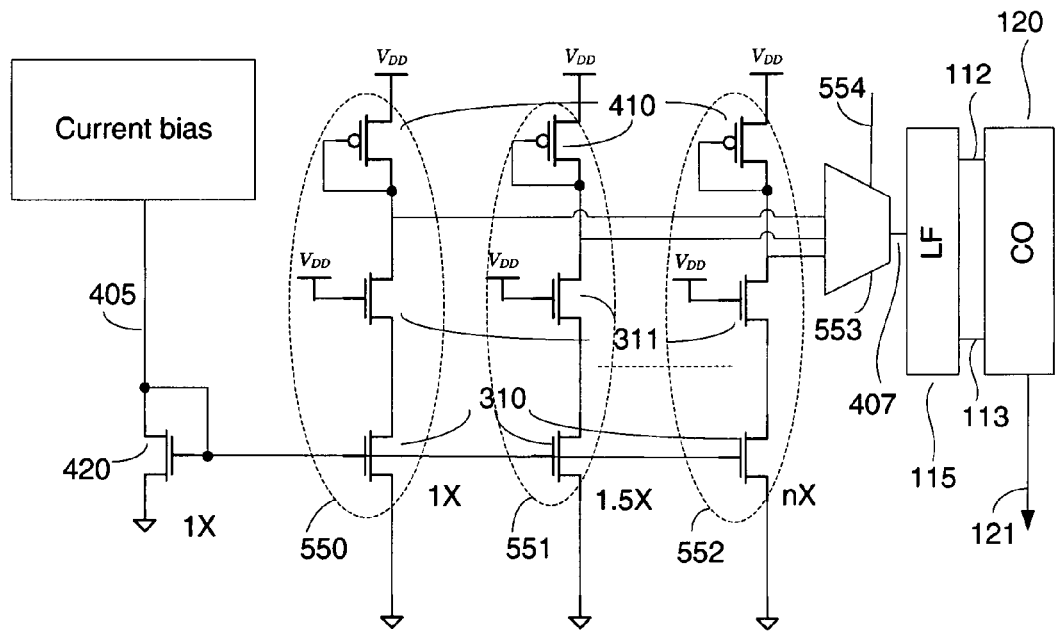
FIG. 5B illustrates a simplified block diagram of a control circuit according to an embodiment of the present invention.

FIG. 5B illustrates a simplified block diagram of a control circuit according to an embodiment of the present invention. Select circuit 553 may be coupled to receive outputs of control circuits 550-552, and provide an output coupled to a loop-filter circuit 115. Outputs of the control circuits 550-552 of FIG. 5B may be selectively coupled to output signal 407. The output signal 407 of FIG. 5B may be coupled to an input of loop-filter circuit 115, and the loop-filter circuit 115 may generate bias values coupled to signals 112 and 113. Signals 112 and 113 may be coupled to inputs of a controlled oscillator circuit 120 of FIG. 5B. The control circuit 120 of FIG. 5B may include transistors 310, 311, and 410 coupled to one another in the same way as control circuit 400 of FIG. 4, which has been described in details. The circuit of FIG. 5B may include additional transistors coupled to disable and/or enable the control circuits 550-552. The control circuits 550-552 of FIG. 5B may generate multiple outputs, each having a bias value different from one another. Outputs of control circuits 550-552 of FIG. 5B may be coupled to inputs of a select circuit 553. Control circuits 550-552 each may include NMOS transistor 310, where value of each NMOS transistor 310 may be different from one another. Each of the control circuits 550-552 may include transistors having different geometries. For example, transistor 310 may have the following sizes 1×, 1.5×, and nX, where X may represent W/L of NMOS transistor 420 of FIG. 5B. The different geometries for transistor 310 may enable each of the control circuits 550-552 to generate a bias value, where bias values of each control circuit may be different from one another. The bias value for each control circuit may depend on the size ratio of transistor 310 and transistor 420 as previously described. The control oscillator circuit 120 may output a frequency responsive to a bias value coupled to its input. In one example, the control circuits 550-552 of FIG. 5B may output a range of bias values. The range of bias values may enable the controlled oscillator 120 to output a signal 121, where signal 121 may have a range of frequency values.

Figure 5C:
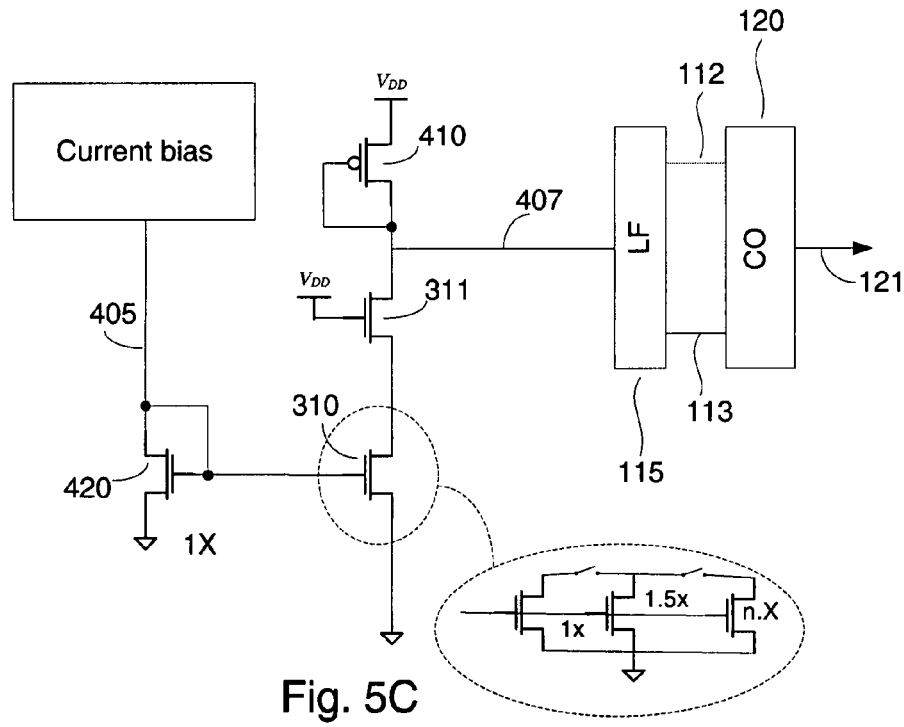
FIG. 5C illustrates another simplified block diagram of a control circuit according to an embodiment of the present invention.

FIG. 5C illustrates another simplified block diagram of a control circuit according to an embodiment of the present invention. Control circuit of FIG. 5C may receive a fixed or a constant current bias value coupled to signal 405, and may generate a bias value coupled to output signal 407. Output signal 407 may be coupled to a loop-filter circuit 115, and output of the loop-filter circuit 115 may be coupled to input of control oscillator circuit 120. Output signal 407 may have different bias values, where the bias values may depend on size ratio of NMOS transistor 310 and NMOS transistor 420 of FIG. 5C. The control circuit of FIG. 5C may include transistors 310, 311, and 410 coupled to one another in the same way as control circuit 400 of FIG. 4, which it has been described in details. The circuit in FIG. 5C may include additional transistors coupled to disable and/or enable the control circuit. NMOS transistor 310 of the control circuit in FIG. 5C may be programmable, where the size of transistor 310 may be selectable from a range of sizes. For instance, each selectable transistor that may represent transistor 310 in the control circuit of FIG. 5C may enable the control circuit to generate a different bias value. Output signal 407 may have a bias value responsive to current bias value coupled to signal 405 of FIG. 5C multiplied by the size ratio of transistor 310 and transistor 420. The control oscillator circuit 120 of FIG. 5C may output a frequency responsive to a bias value coupled to signal 407. In one example, the control circuit of FIG. 5C may output a range of bias values, where the range of bias values may enable the controlled oscillator 120 to output a range of frequency values.

Figure 6:
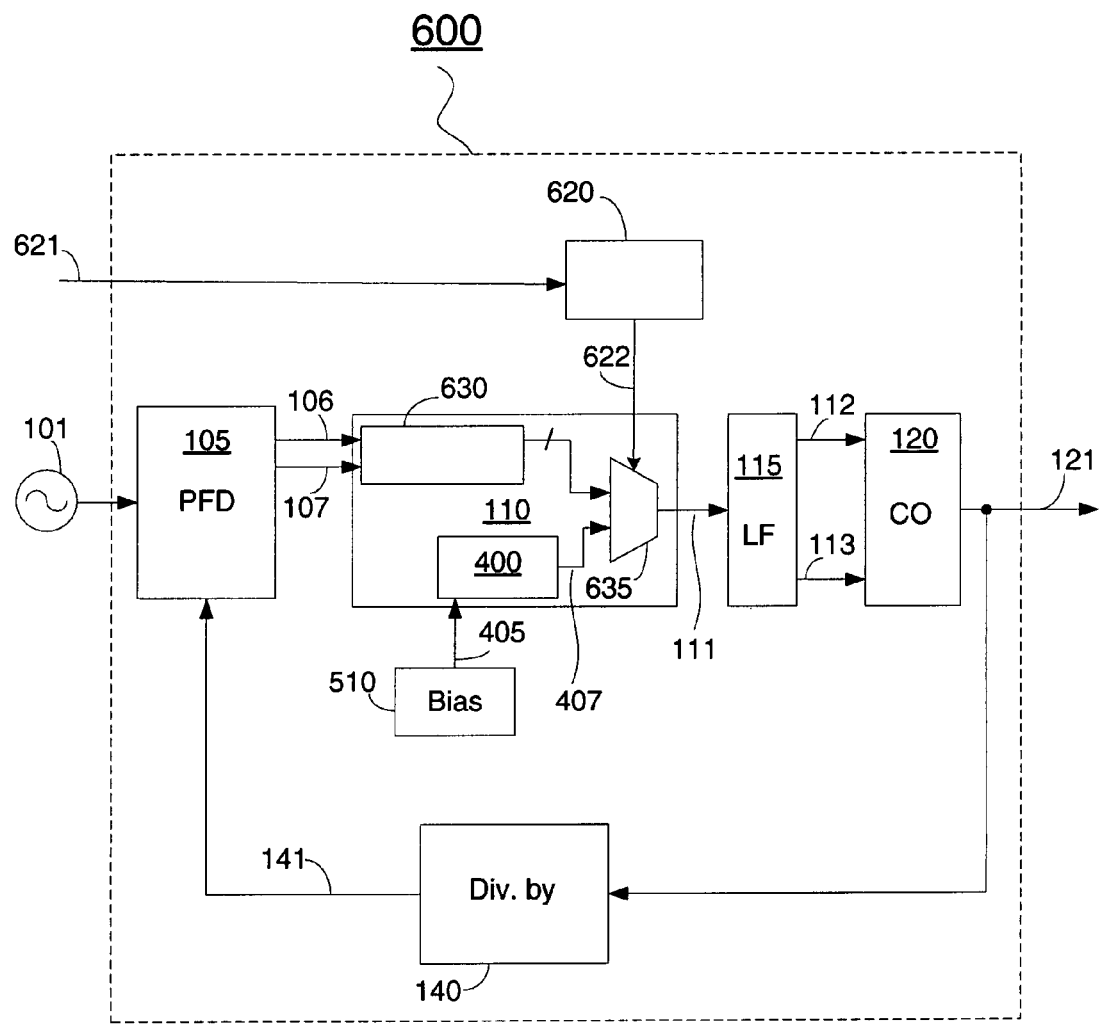
FIG. 6 illustrates a block diagram representing a PLL circuit according to an embodiment of the present invention.

FIG. 6 illustrates a block diagram representing a PLL circuit 600 according to an embodiment of the present invention. The PLL circuit 600 may include PFD circuit 105 coupled to receive a reference signal source 101 and signal 141, and may generate output signals 106 and 107. Signals 106 and 107 are responsive to phase and/or frequency difference between the reference signal source 101 and signal 141. A charge-pump (CP) circuit 110 may be coupled to receive signals 106 and 107 of the PFD circuit 105. The CP circuit 110 may also receive signals 405 of a current-bias circuit 510. Signal 405 may be coupled to receive a current value from circuit 510. Also, the current coupled to signals 405 may be programmable. The CP circuit 110 may have two modes of operation. Operating the PLL in a first mode, where the first mode is based on the first control. The CP circuit 110 of FIG. 6 may generate fixed output bias coupled to signal 407 that is coupled to loop-filter circuit 115. The loop-filter circuit 115 may generate signals 112 and 113 coupled to a control oscillator circuit 120. Signals 112 and 113 may enable the controlled oscillator circuit 120 of the PLL circuit 600 to generate an output signal 121 oscillating at a constant frequency. According to an embodiment of the present invention the controlled oscillator circuit 120 may be a current controlled oscillator. In another example, a voltage controlled oscillator may be used with minor changes to a loop-filter circuit and/or charge-pump circuit. Circuits needed to implement the voltage controlled oscillator design as well known to skilled persons in that art. The frequency value generated by the controlled oscillator circuit 120 in the first mode may be responsive to a bias value generated by the charge-pump circuit 110, and may not be related to reference signal source 101. Operating the PLL in a second mode, where the second mode is based on the second control. The charge-pump circuit 110 may generate a variable output bias coupled to signal 407 responsive to a frequency and/or phase difference between reference signal source 101 and signal 141. The variable output bias may enable the loop-filter circuit 115 to generate signals 112 and 113 that may engage the controlled oscillator circuit 120 of the PLL circuit 600 to generate an output signal 121 having a frequency value and phase relationship to the reference signal source 101. The first control and the second control may be selected by asserting a decision output signal or select signal 622 generated by a decision circuit 620. The decision select signal 622 may be coupled to a select input of a select circuit 635. The decision output signal 622, when asserted, may enable the select circuit 635 to couple either an output from circuit 630 or an output from circuit 400 of the charge-pump circuit 110 of circuit 600 to an input of a loop-filter circuit 115. The loop-filter circuit 115 may generate output signals 112 and 113 coupled to inputs of controlled oscillator circuit 120 of circuit 600. In one example, charge-pump circuit 110 may include the decision circuit 620, and the decision circuit 620 may include the select circuit 635. Circuit 400 of the charge-pump circuit 110 may generate a value coupled to signal 407. This may be indicative that the PLL circuit 600 operating in the first mode. Conversely, circuit 630 of the charge-pump circuit 110 may generate a value coupled to signal 407. This may be indicative that the PLL circuit 600 operating in the second mode. In one example, decision circuit 620 of the PLL circuit 600 may receive a control signal 621. The control signal 621 may be a manually actuated signal, or a feedback signal, or an automatically generated signal that may initiate the decision circuit 620 to switch between the first and second controls. Circuit 400 and/or circuit 635 may be external to the charge-pump circuit 110 of circuit 600.

Operating the PLL circuit 600 in the first mode may engage the controlled oscillator circuit 120 to output a predetermined frequency responsive to a bias value or programmable bias value generated by control circuit 400. In one example, initializing the PLL circuit 600 in by choosing the first mode may enable the controlled oscillator circuit 120 to generate an output signal having a constant frequency value or oscillation. The constant frequency may be responsive to a bias value generated by control circuit 400, where control circuit 400 may receive a constant bias current from circuit 510. For instance, bias currents generated by circuit 510 may be constant over a wide operating conditions including voltage, process, and temperature variations. The PLL circuit 600 may be configured to operate in the first mode, where the output signal 121 of the controlled oscillator circuit 120 may generate an oscillation or frequency value within a known range over various conditions. The various conditions may include variation in supply voltage and/or temperature and/or process parameters. Divider circuit 140 may be coupled to receive the controlled oscillator circuit 120 output signal 121 and may generate at least one output signal 141. The output signal 141 may have a frequency value divided-down from a frequency value of output signal 121. The frequency value of output signal 141 may be in a close range of a frequency of the reference signal source 101, while the CP circuit 110 generating the first control. When the CP circuit 110 is configured to generate the second control, the PLL circuit 600 may attain or acquire frequency and/or phase lock rapidly. In general, a PLL circuit 600 may lock (frequency and/or phase) rapidly if the reference signal source 101 and the divided-down input signal 141 of the PFD are in range (frequency and/or phase) of one another.

In another example, the PLL circuit 600 may be a part of a clock data recovery (CDR) circuit. For instance, the CDR circuit may lose lock, meaning the output signal 121 of the controlled oscillator circuit 120 of the PLL circuit 600 may have a frequency value not related in frequency and/or phase to a reference input signal of the CDR circuit. The loss of lock may be caused by plethora of reasons. For instance, the loss of lock may be attributed to a loss of the reference input signal, or the reference input signal may have a different frequency value, where the PLL circuit 600 may not be able to track reference input signal in its present configuration, etc. In another example, according to an embodiment of the present invention, where the PLL circuit 600 is a part of multi gigabit transceiver (MGT) of a programmable logic device (PLD). The PLL circuit 600 may have a wide frequency operating range, i.e., 1.00 GHz -7.00 GHz. Operating the PLL circuit 600 strictly in the second mode may generate undesirable results. The controlled oscillator circuit 120 may generate a frequency value that may cause the PLL circuit 600 to operate in inappropriate frequency range and/or fail functionally. The PLL circuit 600, if operated strictly in the second mode, may experience additional modes of failures over a range of process, voltage, and temperature variations. For a reliable and consistent performance, the PLL circuit 600 may be initiated in the first mode then switched to operate in the second mode. Configuring the PLL circuit 600 to operate in the first mode may be accomplished by configuring the charge-pump circuit 110 to engage the controlled oscillator circuit 120 to generate output signal 121 having a frequency value responsive to a bias value, where the bias value generated by control circuit 400 may be programmable. While the PLL circuit 600 configured to operate in the first mode, signal 141 may have a constant frequency value in close proximity to a frequency value of the reference signal source 101. For a reliable PLL circuit 600 operation, a user may configure the PLL circuit 600 to start in the first mode, then re configure the PLL 600 to operate in the second mode. The second mode is where the PLL circuit 600 may generate an output signal 121 related in frequency and/or phase to reference input source 101. The above described steps for operating PLL 600 circuit may produce a reliable and fast lock/acquisition (frequency and/or phase) operation over a vast range of parameters such as voltage, temperature, and process.

Figure 7:
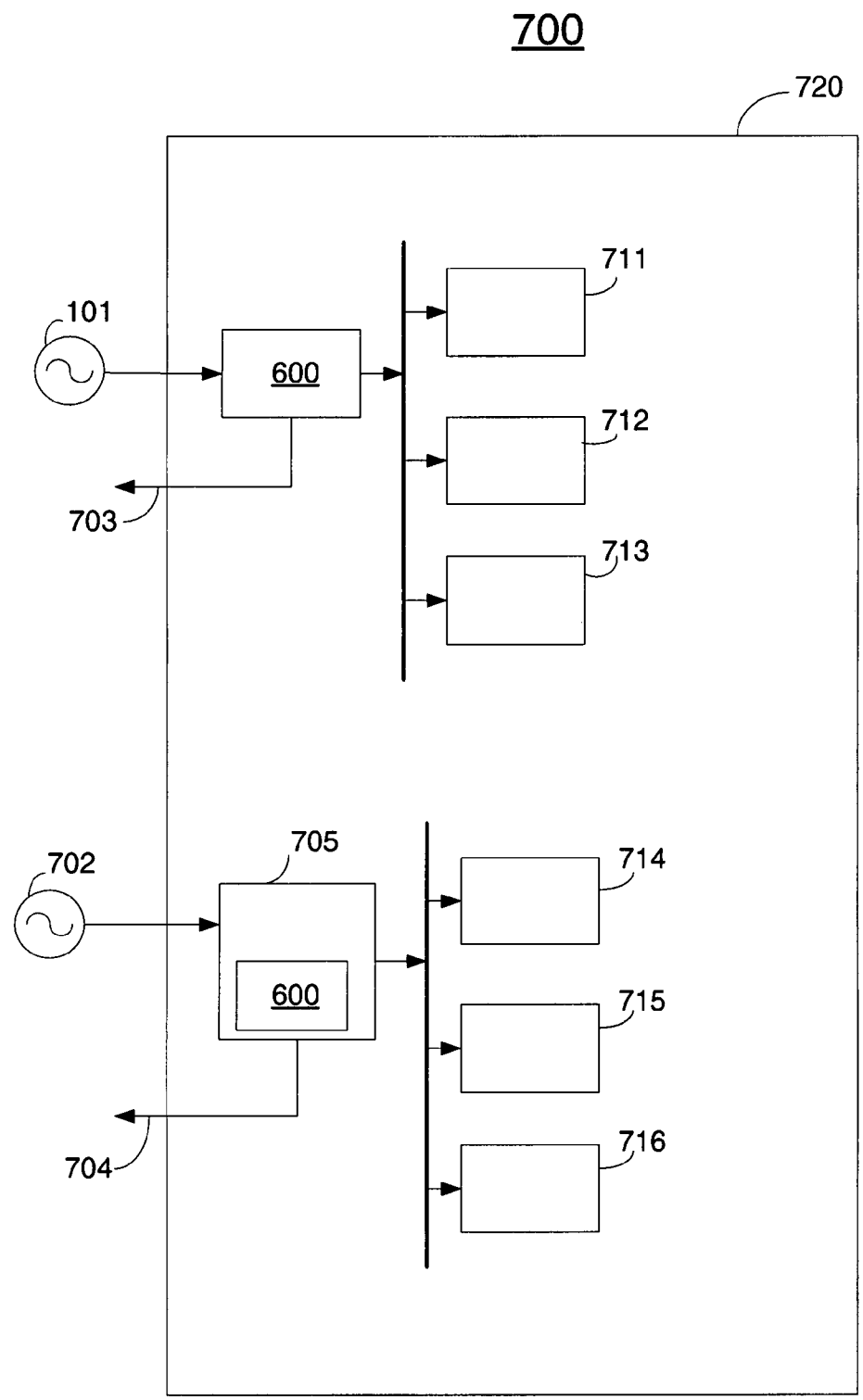
FIG. 7 illustrates an integrated circuit (IC) including at least one PLL circuit according to an embodiment of the present invention.

FIG. 7 illustrates an integrated circuit (IC) 720 including the PLL circuits 600 according to an embodiment of the present invention. The IC 720 may include multiple instantiations of the PLL circuit 600 and may include multiple circuit designs 711-716. The multiple circuit designs 711-716 may have different frequency requirements. In one example, the PLL circuit 600 may be a part of a clock manager circuit 705, where the clock manager 705 may be coupled to receive a reference signal source 702. The clock manager circuit 705 may generate multiple clock outputs. Other types of reference input and/or outputs are well known to skilled persons in the art. In another example, circuit 705 may generate a clock output 704 that may be used by other ICs or circuit module. Circuit 705 may also provide output that can be used to couple to circuit designs 714-716. In another example, the IC 720 may include the PLL circuit 600 coupled to receive reference signal source 101, and may generate multiple clock outputs. Circuit designs 711-713 may receive at least one clock output generated by the PLL circuit 600 of the IC 720. The PLL circuit 600 of the IC 720 may also generate clock output 703, where clock output 703 may be available for monitoring and/or use by other circuits or ICs and/or circuit module.

In another example, the PLL circuit 600 may be used in an application where an external signal or reference oscillators such as reference signal source 101 and/or 702 are not available. The PLL circuit 600 may be operated in the first mode, where the controlled oscillator 120 may output a fixed frequency value. The fixed frequency value may be responsive to a programmable bias value generated by control circuit 400 of the charge-pump circuit 110. The fixed frequency may be used to operate a circuit requiring a clock input. In another example, the PLL circuit 600 may be used in the first mode to generate a very low frequency coupled to various circuits to address an important reliability problem known as negative bias-temperature instability (NBTI). In general, NBTI is a reliability issue affecting IC fabricated in a sub micron processes, which may significantly shifts threshold voltage and reduces drive current. There are also indications that NBTI worsens exponentially with thinning gate oxide, and threshold voltage (Vt) shifts on the order of 20-50 mV are serious for devices operating at 1.2 V or below. For instance, providing a very low frequency signal to transistors vastly improves IC reliability related to NBTI. The PLL circuit 600 operated in the first mode may be configured to provide a low frequency clock output. In general, transistors, and more specifically PMOS transistors, coupled to receive direct current (DC) bias and/or under DC stress for a period of time may experience severe NBTI effects. Coupling an alternating current (AC) bias, such as a clock signal, may decrease such effect and or stress on transistors. The low frequency clock output of the PLL circuit 600 may be coupled to a circuit that may be exposed to NBTI effects. In general, any frequency value may be coupled to transistors to reduce effects of NBTI, but a low frequency value may prevent such NBTI effects in a low power application.

Figure 8:
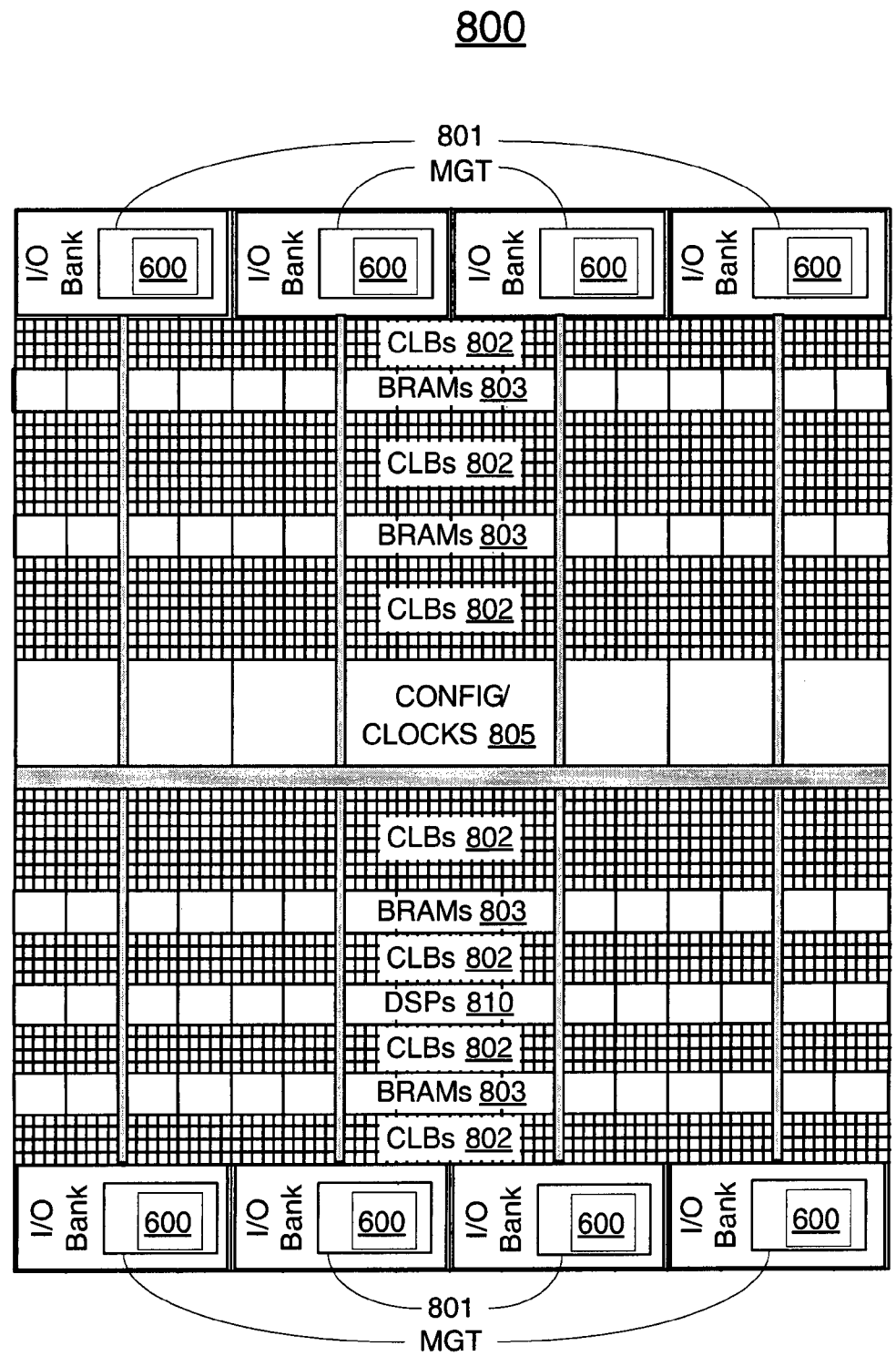
FIG. 8 illustrates a programmable logic device (PLD) including PLL circuits according to an embodiment of the present invention.

FIG. 8 illustrates a programmable logic device (PLD) 800 including the PLL circuit 600 according to an embodiment of the present invention. The PLD 800 may include configurable logic blocks (CLBs) 802, and/or block RAMs (BRAMs) 803, and/or digital signal processors (DSPs) 810, and/or multi gigabit transceiver (MGT) circuits 801. The PLL circuit 600 may be included in at least one of the MGT circuit 801 of the PLD 800. The PLD 800 may have multiple MGT circuits 801 instantiated, where the MGT circuits may be coupled to various circuits and/or blocks of the PLD 800. In one example the PLL circuit 600 may be included in multiple MGT circuits 801 instantiated within the PLD 800. Each of the PLL circuits 600 within the MGT circuits 801 may be coupled to circuits of the PLD 800 and/or other ICs, where each of the PLL circuits 600 may generate output frequency different from other PLL circuits 600. Each of the PLL circuits 600 may be initialized individually, where the initialization or startup conditions may be different for each of the PLL circuits 600. It will be apparent to one skilled in the art after reading this specification that the present invention can be practiced within these and other architectural variations.

Further, resistors, capacitors, pullups, pulldowns, transistors, level shifters, P-channel transistors, N-channel transistors, biasing circuits, oscillators, clock dividers, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known. In one example, the current bias circuit 510 of FIG. 5 may use different transistor geometry to generate the multiple current values needed.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents. Note that claims listing steps do not imply any order of the steps. Trademarks are the property of their respective owners.

What is claimed is:

1. A phase-locked loop (PLL), comprising:
a phase frequency detector having a first input coupled to receive a reference signal;
a charge-pump coupled to the phase frequency detector, wherein the charge-pump generates a first control and a second control;
a loop-filter having an input coupled to selectively receive one of the first control and the second control;
a controlled oscillator coupled to the loop filter, the controlled oscillator comprising a current controlled oscillator;
a divider circuit coupled between an output of the controlled oscillator and a second input of the phase frequency detector; and
a decision circuit having first and second inputs coupled to receive the first control and the second control, having a decision circuit output coupled to the input of loop-filter, and having a select input, wherein when operating the PLL in a first mode corresponding to the loop-filter input receiving the first control, the controlled oscillator generates a constant frequency, wherein when operating the PLL in a second mode corresponding to the loop-filter input receiving the second control, the controlled oscillator generates a frequency tracking the reference signal, and wherein a decision select control signal coupled to the select input selectively couples one of the first control and the second control to the decision circuit output.

2. The PLL recited in claim 1, wherein the controlled oscillator comprises a delay circuit, and wherein the charge-pump comprises a control circuit comprising a replica circuit of the delay circuit of the controlled oscillator.

3. The PLL recited in claim 2, further comprising a current-bias circuit having a plurality of outputs, wherein at least one output of the plurality of outputs of the current-bias circuit is coupled to the control circuit, and wherein the at least one output of the plurality of outputs of the current-bias circuit is programmable.

4. The PLL recited in claim 2, wherein the control circuit comprises:

a first NMOS transistor having a source coupled to ground potential, a drain coupled to receive a constant current, and a gate coupled to the drain of the first NMOS transistor;

a switch, comprising a second NMOS transistor and a first PMOS transistor, wherein a source of the second NMOS transistor is coupled to a source of the first PMOS transistor and the gate of the first NMOS transistor, a drain of the second NMOS transistor is coupled to a drain of the first PMOS transistor, a gate of the first PMOS transistor is coupled to a power-down signal, and a gate of the second NMOS transistor is coupled a complement of the power-down signal;

a third NMOS transistor having a source coupled to the ground potential, and a gate coupled to the drain of the first PMOS transistor;

a fourth NMOS transistor having a source coupled to the ground potential, a drain coupled to the drain of the first PMOS transistor, and a gate coupled to the power-down signal;

a fifth NMOS transistor having a gate coupled to a supply voltage, and a source coupled to a drain of the third NMOS transistor;

a second PMOS transistor having a drain coupled to a drain of the fifth NMOS transistor, a gate coupled to the drain of the fifth NMOS, and a source coupled to the supply voltage; and a third PMOS transistor having a gate coupled to the complement of the power-down signal, a source coupled to the supply voltage, wherein the drain of the second PMOS transistor and a drain of the third PMOS transistor are coupled together to provide the first control.

5. The integrated circuit recited in claim 4, wherein the replica circuit comprises the third NMOS transistor, the fifth NMOS transistor, and the second PMOS transistor.

6. An integrated circuit comprising:

a phase-locked loop (PLL) comprising:

a phase frequency detector having a first input coupled to a reference signal;

a charge-pump coupled to the phase frequency detector and generating a first control and a second control;

a loop-filter;

a decision circuit having a decision circuit output coupled to the loop-filter, having a first decision circuit input coupled to the first control, a second decision circuit input coupled to the second control, and a select input;

a controlled oscillator coupled to the loop-filter; and a divider circuit coupled between the controlled oscillator and a second input of the phase frequency detector;

wherein a select signal coupled to the select input selectively couples one of the first control and the second control to the loop-filter, wherein when operating the PLL in a first mode corresponding to the loop-filter receiving the first control, the controlled oscillator generates a constant frequency, and wherein when operating the PLL in a second mode corresponding to the loop-filter receiving the second control, the controlled oscillator generates a frequency tracking the reference signal; and a current-bias source having a plurality of current-bias outputs, wherein at least one current-bias output of the plurality of current-bias outputs is programmable and coupled to the charge-pump.

7. The integrated circuit recited in claim 6, wherein the controlled oscillator comprises a delay circuit, and wherein the charge-pump further comprises a control circuit comprising a replica circuit of the delay circuit of the controlled oscillator.

8. The integrated circuit recited in claim 7, wherein the control circuit is coupled to receive the at least one programmable current-bias output of the current-bias source.

9. The integrated circuit recited in claim 8, wherein the control circuit generates the first control responsive to the at least one programmable current-bias output of the current-bias source.

10. The integrated circuit recited in claim 9, wherein operating the PLL in the first mode reduces the effects of negative bias-temperature instability (NBTI).

11. The integrated circuit recited in claim 10, wherein the controlled oscillator is a current controlled oscillator.

12. The integrated circuit recited in claim 11, wherein the control circuit is a current to voltage converter.

13. The integrated circuit recited in claim 6, wherein the integrated circuit is a programmable logic device (PLD).

14. The integrated circuit recited in claim 13, further comprising a multi gigabit transceiver (MGT) including a clock data recovery (CDR) circuit, wherein the CDR includes the PLL.

* * * * *